(12) United States Patent
Cooper

(10) Patent No.: US 6,849,548 B2
(45) Date of Patent: Feb. 1, 2005

(54) METHOD OF REDUCING PARTICULATE CONTAMINATION DURING POLISHING OF A WAFER

(75) Inventor: Steven P. Cooper, Battle Ground, WA (US)

(73) Assignee: SEH America, Inc., Vancouver, WA (US)

(*) Notice: Subject to any disclaimer, the term of this patent is extended or adjusted under 35 U.S.C. 154(b) by 86 days.

(21) Appl. No.: 10/117,522

(22) Filed: Apr. 5, 2002

(65) Prior Publication Data
US 2003/0190810 A1 Oct. 9, 2003

(51) Int. Cl.[7] .................... H01L 21/302; H01L 21/461
(52) U.S. Cl. ........................................ 438/692; 438/693
(58) Field of Search .......................................... 438/692

(56) References Cited

U.S. PATENT DOCUMENTS

| | | | |
|---|---|---|---|
| 5,645,737 A | | 7/1997 | Robinson et al. |
| 5,695,384 A | | 12/1997 | Beratan |
| 5,704,987 A | * | 1/1998 | Huynh et al. .................... 134/6 |
| 5,942,131 A | | 8/1999 | Robinson et al. |
| 6,096,650 A | | 8/2000 | Robinson et al. |
| 6,258,721 B1 | * | 7/2001 | Li et al. ........................ 438/693 |
| 6,387,289 B1 | * | 5/2002 | Wright .......................... 216/88 |
| 2003/0134576 A1 | * | 7/2003 | Chadda et al. ................. 451/41 |

FOREIGN PATENT DOCUMENTS

EP      1 155 777 A1      11/2001

* cited by examiner

Primary Examiner—John F. Niebling
Assistant Examiner—Angel Roman
(74) Attorney, Agent, or Firm—Alston & Bird LLP

(57) ABSTRACT

A method of polishing the surface of a semiconductor wafer such that the adherence of abrasive particles to the surface of the wafer is minimized, resulting in a semiconductor wafer having a reduced number of pits. The invented method has two stages. The first stage follows traditional polishing practice using chemical mechanical polishing. The second stage diverges from traditional practices and provides for a final polishing step or steps involving the polishing of the wafer with a polishing solution having no abrasive particles.

19 Claims, 1 Drawing Sheet

METHOD OF REDUCING PARTICULATE CONTAMINATION DURING POLISHING OF A WAFER

FIELD OF THE INVENTION

The invention relates to the production of wafers for use in semiconductor devices. More specifically, the invention relates to a method of polishing wafers with emphasis on the reduction of particulate contamination remaining upon the wafer surface after the polishing process.

BACKGROUND OF THE INVENTION

In the production of semiconductor wafers, it is important to produce a wafer having a very smooth and planar surface. Irregularities in the wafer surface introduced during wafer processing may be amplified during further processing and may result in an unusable wafer. Irregularities or defects within the wafer surface may also lead to ineffective lithographic processing, resulting in a defective semiconductor device. Therefore, the minimization of defects on the wafer surface is of the utmost importance.

Chemical mechanical polishing, or CMP, is the most common method of polishing wafer surfaces in order to obtain a planar surface. In CMP, a slurry of etching chemicals and abrasive particles is applied to the surface of a wafer through a porous polishing pad. The action of the polishing pad contacts the slurry with the wafer surface.

As the name implies, CMP acts through both chemical and mechanical action. The chemicals of the CMP slurry, typically water and ammonia, oxidize the surface of the wafer, causing the surface material of the wafer to corrode. After parts of the surface are corroded, the mechanical action of the rotating polishing pad and the abrasive particles within the slurry act mechanically to flatten the wafer surface and remove corroded residue.

In practice, several polishing steps are involved in polishing the surface of a wafer. Each successive polishing step uses a slurry having smaller abrasive particles than the previous slurry. The use of the different sizes of particles allows the polishing of the wafer to begin with a rough polishing and to finish with fine polishing. The wafer is rinsed with water or some other neutralizing substance between each step in order to neutralize the action of the etchant. The flow of water or neutralizing substance across the surface of the wafer also acts to rinse away the abrasive particles.

The process of polishing a wafer is thought to have a great influence on the degree of pitting that occurs within the wafer during subsequent processing. Pitting is a deformity in the crystalline structure of a wafer surface which impairs the ability of the wafer to be properly photolithographically processed and potentially interferes with the functioning of a semiconductor device formed upon the wafer. Although pitting forms within the surface of a semiconductor wafer during the cleaning phase of wafer production, the pitting is due to defects which originate during the polishing phase of production. The adherence of abrasive particles to the surface of the wafer during polishing leads to uneven etching by the polishing slurry, causing small defects within the wafer. During the wafer cleaning process, the defects from the polishing phase become pits in the surface of the wafer. Though the occurrence of pitting has been lessened by the formulation of advanced polishing slurries and the implementation of new polishing techniques, pitting is still a very real problem which causes the significant rejection of a portion of semiconductor wafers produced.

What is needed is a method of polishing the surface of semiconductor wafers which allows for the global planarization characteristic of chemical mechanical polishing, but prevents surface pitting and other surface defects. Further needed is a method of polishing which prevents the subsequent pitting of a wafer surface which is compatible with standard chemical mechanical polishing procedures so as not to require a significant capital outlay for new polishing equipment.

SUMMARY OF THE INVENTION

The present invention addresses the above-described shortcomings of traditional polishing techniques by providing a method of polishing the surface of a semiconductor wafer such that the adherence of abrasive particles to the surface of the wafer is minimized. Minimizing the number of abrasive particles that are adhered to the surface, the extent to which they are adhered to the surface, and the time they remain adhered to the surface, minimizes the number and severity of defects caused by the adhered particles, thereby minimizing the number of resulting pits and increasing the efficiency of wafer production.

The invented method has two stages. The first stage follows traditional polishing practice using chemical mechanical polishing. The second stage diverges from traditional practices and provides for a final polishing step or steps involving the polishing of the wafer with a polishing solution having no abrasive particles. It has been found that when traditional CMP procedures for polishing are followed by an additional fine polishing of the wafer surface in a CMP apparatus, without abrasive particles in the polishing solution, the resulting wafer has a surface that is highly polished but that has a minimum of abrasive particles adhered to the surface.

By first polishing the surface of the wafer using incrementally decreasing sizes of abrasive particles, and then polishing the surface of the wafer using an alkali based etchant having no abrasive particles, the surface of the wafer may be finely polished while causing only a minimum number of defects as a result of the adherence of the abrasive particles. Since the first stage of the method employs conventional chemical mechanical processing, the invented method of polishing the wafers is compatible with and may be substituted for traditional CMP processes while making use of already existing CMP hardware and equipment.

BRIEF DESCRIPTION OF THE DRAWINGS

Figure 1:
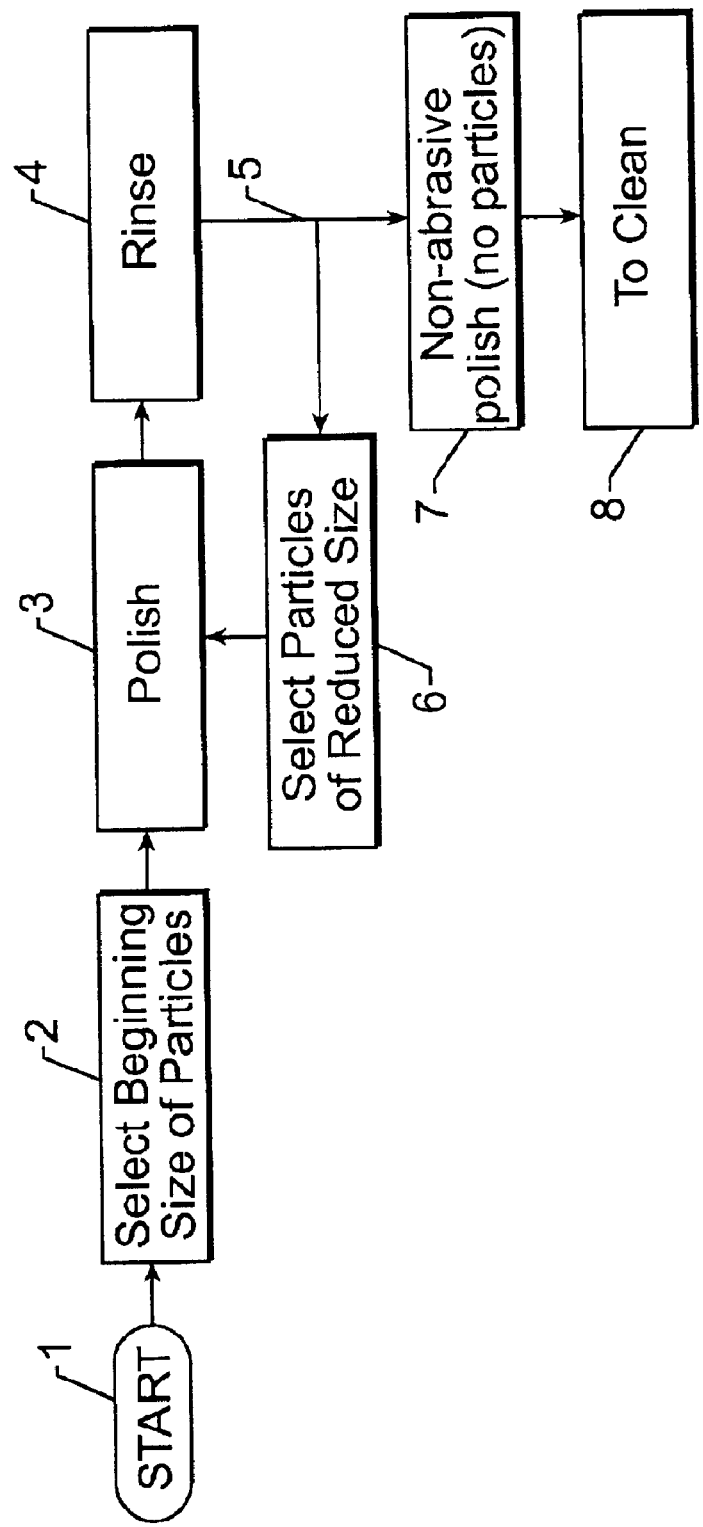

Having thus described the invention in general terms, reference will now be made to the accompanying drawing, wherein:

FIG. 1 is a schematic flow diagram which illustrates an embodiment of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

During the production of a wafer, such as a silicon wafer, the surface of the wafer is polished with a polishing slurry containing an alkali etchant chemical, such as ammonia, and abrasive particulates, usually silica. It is theorized that problems with pitting of the surface, observed during the cleaning phase of wafer production, first develop during the polishing of the wafer. During polishing, the silica particles in the polishing slurry develop an ionic attraction to the pure silicon surface of the wafer. The attraction is due to slight charge differentials between the silicon and silica and is heightened by rapid pH changes in the polishing slurry caused by the pH of the rinse water used between polishing steps. Because of the charge differential, the silica strongly adheres to the surface of the silicon wafer. After polishing, the silica particles which are adhered to the silicon prevent the chemical etchant within the polishing slurry from acting on the silicon material underlying the silica particles. The differential etching between those areas of the wafer that are and are not protected by a silica particle causes defects within the wafer surface. During subsequent cleaning steps, such as SC1 cleaning, the defects develop into pitting within the wafer surface. The pits typically cause crystal defects which are highly undesirable in wafer production. Thus, pitting which is first evidenced during the cleaning stage of wafer production, is thought to be rooted in the adherence of abrasive particles to the wafer surface during the polishing stages of wafer production. The ability to remove particles from the surface of the wafer prior to the cleaning stage, therefore, lessens the occurrence of pitting within the wafer.

Referring now to FIG. 1, as shown in block 1, semiconductor wafers to be polished are supplied, such as from a rough polishing operation. Prior to beginning the main polishing operation, the sizes and types of abrasive particles and the types of etchants to be used during polishing are determined, as shown in block 2. Polishing with the abrasive slurry may theoretically be accomplished in one step, but is generally accomplished in multiple steps, with each polishing step using smaller abrasive particles than previous polishing steps. By utilizing multiple polishing slurries having abrasive particles of decreasing particle size, large surface imperfections are polished out by the large abrasive particles and smaller defects are polished out of the surface by the smaller sized abrasive particles.

For the first polishing step 3, a slurry having the largest selected abrasive particle size is supplied. A typical average particle size for use in the initial polishing step of silicon polishing is about 30 nanometer (nm). The composition of polishing slurries will vary depending on the wafer material to be polished. For polishing silicon wafers, a preferred slurry consists of water (0.1% to 90%), ammonia (0.1% to 10%), a wetting agent (0.1%–10%), and coloidal silica (0.5% to 20%) as the abrasive particulate. Commercially available polishing slurries for use with silicon polishing include Fujimi 3900RS supplied by Fujimi Corporation and Advansil™ supplied by Rodel, Inc. of Phoenix, Ariz. Both slurries commonly contain colloidal silica and are of common capability with respect to wafer pitting observed after polishing. In accordance with the invention, polishing slurries or solutions containing potassium hydroxide or ammonium hydroxide may also be used.

The polishing referred to herein takes place on a chemical mechanical polishing (CMP) apparatus. As defined herein, a CMP apparatus is a device capable of combining a chemical etching step with a mechanical polishing step. The apparatus supplies a mild etchant solution and, optionally, a slurry of abrasive particles to the wafer either directly or through a polishing pad. The polishing apparatus supports the wafer upon a rotatable platen with the surface to be polished facing away from the platen. The polishing pad is pressured against the surface of the wafer and rotated with respect to the wafer. When a slurry of abrasive particles is used, friction of the particles between the wafer and the rotating pad abrades the surface of the wafer. The pad of the CMP is commonly a polyurethane type foam or a felt substrate with a foam covering.

The initial polishing slurry is supplied to a CMP apparatus. For a silicon wafer, the alkaline slurry solution oxidizes the surface of the wafer. Simultaneously, with the formation of the oxide, the abrasive action of the silica particles within the slurry and the movement of the polishing pad abrade the oxides from the surface. Because high, rough portions of the silicon surface are abraded more than low lying portions of the surface, the action of the chemical mechanical polishing tends to planarize the surface of the wafer.

After the initial polishing step 3 is complete, the surface of the wafer is rinsed with deionized water in step 4. The water neutralizes the slight etching action of the slurry solution, and the flow of the water across the surface of the wafer caries away most of the abrasive particulates from the surface of the wafer.

The polishing and rinsing processes are repeated for a predetermined number of cycles, or until the wafer is finely polished, represented by block 5. Each time that the polishing process, blocks 3 and 4, is repeated, a polishing slurry having abrasive particles of a smaller average diameter than the particles of the previous polishing step is selected and supplied to the polishing operation, as shown in step 6. As mentioned, the polishing and rinsing of the wafer surface is repeated until the surface has been finely polished. For polishing silicon wafers, use of a particle size of 13 nm or smaller is typically considered a final polish.

After the wafer has been processed through the final abrasive polish, meaning the last polishing step in which the surface of the wafer is abraded with a particulate slurry, the wafer is again sent through the chemical mechanical process. However, after the final abrasive polish, an alkali etching solution is supplied to the chemical mechanical process in place of the polishing slurry and the wafer is subjected to a non-abrasive polishing step 7.

It is preferred that the alkali etching solution have the same composition as the slurry used for polishing of the wafer, merely lacking the abrasive particulates. For silicon wafers, the preferred etching solution is a solution, which generally contains a 0.1%–90% water, 0.1%–10% ammonia, and 0.1%–40% wetting agent. Both Fujimi 3900RS and the Rodel polishing slurries mentioned above may be used as the alkali etching solution upon removal of the colloidal silica or other abrasive components from the slurries.

Most chemical mechanical polishing equipment is highly automated and is designed to automatically provide for polishing of wafers through a series of polishing steps. Most polishing equipment is designed to proceed through a series of polishing and rinsing steps, using a series of polishing slurries having decreasing abrasive particle sizes. The invented process may be successfully implemented through the use of such polishing equipment by substituting the particle free polishing solution for the polishing slurry used in the final polish step of the polishing operation. Preferably, an extra polishing step is programmed into the polishing equipment and the particulate free polishing solution is used for the last polishing step. Alternatively, for equipment that is not easily reprogrammed, a final polish slurry such as a 13 $\mu$m silica slurry may be supplied to the equipment for a first portion of the final polishing cycle and a non-abrasive polish solution may be supplied to the equipment for a second portion of the final polishing cycle. After the non-abrasive polish, the wafer is transported to a cleaning station in step 8 from which it continues on in the wafer production process.

The method of using a non-abrasive polish solution with the last polishing step for semiconductor wafer production is preferably used with and is particularly effective with silicon/silica polishing systems. The method is alternatively applicable to metal/alumina systems or any other CMP systems for polishing other types of wafers wherein a particulate abrasive is unfavorably adhered to the surface of a wafer.

EXAMPLES

Experiments were preformed to determine if the use of colloidal silica free slurry reduces pitting in the production of silicon wafers. A group of epitaxially layered wafers were HF stripped. The HF strip was used to create a sensitive wafer surface and to promote the defects being analyzed, so that they were more easily observed. The group of wafers was then separated into two sets of three wafers each.

The first set of wafers (wafers numbered 1 through 3) was dipped in a final polish slurry with a silica particle concentration in the range of between 1% and 30%, with particle sizes in the range of 1–500 nanometer. The slurry solution was prepared in a quartz beaker that was soaked with 1% citric acid for 1 hour and then triple rinsed with deionized water. The dip was preformed in a class 100 clean room. The dip took place for 10 seconds. The wafers were then agitated in deionized water for 1 minute, soaked in deionized water for 1 minute, and then transferred in a polypropylene box to a pre-clean station.

The second set of wafers (wafers numbered 4 through 6) was dipped in a final polish slurry with the colloidal slurry particles removed. The slurry solution was prepared in a quartz beaker that was soaked with 1% citric acid for 1 hour and then triple rinsed with deionized water. The dip was preformed in a class 100 clean room. The dip took place for 10 seconds. The wafers were then agitated in deionized water for 1 minute, soaked in deionized water for 1 minute, and then transferred in a PP box to preclean.

After being precleaned, wafers were cleaned in an SC1RT cleaning process, which is similar to the standard SC1 process known in the art but utilizes ammonium hydroxide, hydrogen peroxide, and water rather than the ammonia, hydrogen peroxide, and water usually used in the SC1 process. The SC1RT process accelerates wafer pitting that would normally occur in the SC1 process so that the effect of wafer polishing upon subsequent pitting may be more easily studied. After the SC1RT process, the wafers were cleaned with the standard FC2 cleaning process using hydrogen chloride, peroxide, and water. After FC2 cleaning, wafer pitting was measured on an SP1, a device which measures particles on the surface of a wafer by recording the distortion in the beam of a laser's reflection off the wafer surface. The surface of the wafer was further reviewed with a scanning electron microscope. Defects larger than 0.3 $\mu$m, the particle size most associated with wafer pitting, were measured, with the results shown in Table 1.

TABLE 1

| Wafer # | Colloidal Slurry Particles | >3.0 $\mu$m | 2.0 $\mu$m | 1.0 $\mu$m | 0.9 $\mu$m | 0.8 $\mu$m | 0.7 $\mu$m | 0.6 $\mu$m | 0.5 $\mu$m | 0.4 $\mu$m | 0.3 $\mu$m | Total |
|---|---|---|---|---|---|---|---|---|---|---|---|---|
| 1 | Yes | 2 | 1 | 3 | 2 | 2 | 1 |   | 3 | 5 | 6 | 25 |
| 2 | Yes | 2 | 1 | 1 | 3 |   |   | 2 | 4 | 7 | 4 | 24 |
| 3 | Yes | 1 |   | 3 | 2 | 1 | 1 | 4 | 3 | 1 | 1 | 10 |
| 4 | No | 2 |   | 1 |   |   |   |   | 1 |   |   | 4 |
| 5 | No |   |   |   | 1 |   | 1 |   |   | 1 |   | 3 |
| 6 | No |   | 1 |   |   |   | 1 | 2 | 5 | 4 |   | 13 |

The results of the experiments show that a wafer polished with a final polish solution having no abrasive particles prior to cleaning has fewer overall defects, on average, than similar wafers polished with a final polish slurry containing abrasive particles prior to cleaning. It is surmised that since the number of surface defects is reduced by polishing the wafer with a final polish in a non-abrasive polishing solution, the overall number of pits caused by pitting of the defects during the subsequent cleaning process is also reduced.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method of polishing the surface of a semiconductor wafer such that the number of defects within the wafer surface is reduced, said method sequentially comprising:
    chemically-mechanically polishing the wafer surface with at least one slurry containing abrasive particles with average size between about 13 $\mu$m and about 30 $\mu$m, and
    chemically-mechanically polishing the wafer surface with at least one solution comprising a compound selected from the group consisting of ammonia, ammonium hydroxide, and potassium hydroxide, which is substantially free of abrasive.

2. The method of claim 1 wherein polishing with said at least one slurry comprises polishing with at least one etchant slurry.

3. The method of claim 2 wherein the polishing with at least one etchant slurry comprises polishing with at least one alkali etchant slurry.

4. The method of claim 3 wherein the polishing with at least one etchant slurry comprises polishing with a solution of water, ammonia, wetting compound, and abrasive particles.

5. The method of claim 1 wherein the polishing with at least one slurry containing abrasive particles comprises polishing with at least one slurry containing silica abrasive particles.

6. The method of claim 1 wherein the polishing with at least one slurry containing abrasive particles comprises polishing with at least one slurry containing alumina abrasive particles.

7. The method of claim 1 wherein polishing the wafer surface comprises polishing a silicon wafer surface.

8. The method of claim 1 wherein polishing the wafer surface comprises polishing a metallic wafer surface.

9. The method of claim 1 further comprising the step of rinsing the wafer surface following each polishing step.

10. The method of claim 9 wherein rinsing the wafer surface comprises rinsing the wafer surface in a pH neutral solution.

11. The method of claim 10 wherein the step of rinsing the wafer surface in a pH neutral solution comprises rinsing the wafer surface in deionized wafer.

12. The method of claim 1 wherein polishing the wafer surface with at least on slurry comprises sequentially polishing the wafer surface with more than one slurry wherein each successive slurry contains a particulate abrasive having a smaller average size than those contained by the preceding slurry.

13. The method of claim 12 wherein the composition of each non-abrasive portion of each said more than one slurry is the same.

14. A process of polishing the surface of a wafer such that the surface of the wafer remains substantially free of defects, said process sequentially comprising:

chemically-mechanically polishing the wafer surface with at least one slurry containing abrasive particles selected from the group consisting of silica particles, alumina particles, and combinations thereof in an amount greater than 1% and chemically-mechanically polishing the wafer surface with at least one solution comprising a compound selected from the group consisting of ammonia, ammonium hydroxide, and potassium hydroxide, containing an abrasive in an amount of substantially zero.

15. The process of claim 14 wherein polishing with said at least one slurry comprises polishing with at least one etchant slurry.

16. The process of claim 15 wherein the polishing with at least one etchant slurry comprises polishing with a solution of water, ammonia, wetting compound, and abrasive particles.

17. The process of claim 14 wherein the polishing with at least one slurry containing abrasive particles comprises polishing with at least one slurry containing abrasive particles with average sizes between about 13 $\mu$m and about 30 $\mu$m.

18. The process of claim 14 further comprising the step of rinsing the wafer surface following each polishing step.

19. The process of claim 14 wherein the polishing the wafer surface with at least one slurry comprises sequentially polishing the wafer surface with more than one slurry wherein each successive slurry contains a particulate abrasive having a smaller average size than those contained by the preceding slurry.

* * * * *